United States Patent
Qian et al.

(10) Patent No.: US 9,208,734 B2
(45) Date of Patent: Dec. 8, 2015

(54) SHIFT REGISTER AND DRIVING METHOD THEREOF

(71) Applicant: Shanghai Tianma Micro-Electronics Co., Ltd., Shanghai (CN)

(72) Inventors: Dong Qian, Shanghai (CN); Changho Tseng, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 14/083,304

(22) Filed: Nov. 18, 2013

(65) Prior Publication Data

US 2014/0079176 A1    Mar. 20, 2014

Related U.S. Application Data

(63) Continuation of application No. PCT/CN2012/084203, filed on Nov. 17, 2012.

(30) Foreign Application Priority Data

Jun. 29, 2012   (CN) .......................... 2012 1 0224177

(51) Int. Cl.
| | |
|---|---|
| *G11C 19/00* | (2006.01) |
| *G09G 3/36* | (2006.01) |
| *G11C 19/28* | (2006.01) |
| *G11C 19/18* | (2006.01) |
| *H03K 17/16* | (2006.01) |

(52) U.S. Cl.
CPC ............ *G09G 3/3611* (2013.01); *G09G 3/3674* (2013.01); *G11C 19/184* (2013.01); *G11C 19/28* (2013.01); *H03K 17/161* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 8,031,160 B2 * | 10/2011 | Chen et al. ..................... | 345/100 |
| 8,290,115 B2 * | 10/2012 | Kim et al. ........................ | 377/68 |
| 2005/0008114 A1 | 1/2005 | Moon | |
| 2005/0185752 A1 * | 8/2005 | Sasaki et al. .................... | 377/64 |
| 2007/0019775 A1 * | 1/2007 | Tsai et al. ....................... | 377/64 |
| 2007/0071158 A1 * | 3/2007 | Wei et al. ........................ | 377/64 |
| 2007/0153967 A1 * | 7/2007 | Yu ................................... | 377/64 |
| 2007/0258557 A1 * | 11/2007 | Tseng et al. ..................... | 377/64 |
| 2008/0062071 A1 * | 3/2008 | Jeong .............................. | 345/46 |
| 2008/0062097 A1 * | 3/2008 | Jeong et al. ..................... | 345/84 |
| 2009/0129534 A1 * | 5/2009 | Yoshida ........................... | 377/64 |
| 2012/0133574 A1 * | 5/2012 | Wu et al. ......................... | 345/55 |
| 2013/0155044 A1 * | 6/2013 | Ohkawa et al. ................. | 377/64 |
| 2013/0223584 A1 * | 8/2013 | Umezaki .......................... | 377/64 |
| 2013/0266113 A1 * | 10/2013 | Tsuge et al. ..................... | 377/64 |

FOREIGN PATENT DOCUMENTS

| | | |
|---|---|---|
| CN | 100354711 C | 12/2007 |
| CN | 101800026 A | 8/2010 |
| CN | 102467972 A | 5/2012 |

\* cited by examiner

*Primary Examiner* — Tuan T Lam

(74) *Attorney, Agent, or Firm* — Alston & Bird LLP

(57) ABSTRACT

A shift register includes an input terminal, an output terminal, a first clock signal terminal, a second clock signal terminal, a first level signal terminal, a second level terminal, a first capacitor and a second capacitor, and five transistors. The five transistors are controlled by first and second clock signals applied to the respective first and second signal terminals to shift a signal received from the input terminal to the output terminal with a half cycle period delay while maintaining a stable level of the shifted signal at the output terminal.

15 Claims, 5 Drawing Sheets

SHIFT REGISTER AND DRIVING METHOD THEREOF

CROSS-REFERENCES TO RELATED APPLICATIONS

This application claims priority to and is a continuation of PCT/CN2012/084203, filed on Nov. 7, 2012, which claims the benefit of Chinese patent application No. 201210224177.0, filed with the Chinese Patent Office on Jun. 29, 2012 and entitled "SHIFT REGISTER AND DRIVING METHOD THEREOF", the contents of which are incorporated herein by reference in their entirety.

TECHNICAL FIELD

The present invention relates to a gate driving device, and more particularly to a shift register in a Liquid Crystal Display driving circuit and a driving method thereof.

BACKGROUND OF THE INVENTION

In the current epoch with fast scientific and technological development, Liquid Crystal Displays have been widely used in electronic display products such as televisions, computers, telephones and personal digital assistants. A Liquid Crystal Display includes a source driver, a gate driver and a Liquid Crystal Display panel. A pixel array is provided in the Liquid Crystal Display panel, and the gate driver is used to turn on the corresponding pixel rows in the pixel array sequentially, to transfer pixel data outputted from the source driver to pixels so as to display an image to be displayed.

Shift registers are generally used as gate drivers for sequentially turning on the corresponding pixel rows in the pixel array in the prior art. Referring to FIGS. 1 and 2, a schematic diagram showing the structure of the existing shift register is shown in FIG. 1, and an operation timing diagram of the shift register shown in FIG. 1 is shown in FIG. 2.

As shown in FIG. 1, a conventional shift register includes: a first transistor M1, a second transistor M2, a third transistor M3, a fourth transistor M4, a fifth transistor M5, and a sixth transistor M6, where, a gate of the first transistor M1 is connected to a first clock signal terminal CK, a source of the first transistor M1 is connected to an input terminal IN of the shift register, and a drain of the first transistor M1 is connected to a gate of the second transistor M2; a drain of the second transistor M2 is connected to a first level signal terminal, and a source of the second transistor M2 is connected to a drain of the fourth transistor M4; a gate of the third transistor M3 is connected to the first clock signal terminal CK, a source of the third transistor M3 is connected to a second level signal terminal, and a drain of the third transistor M3 is connected to a source of the fourth transistor M4; a gate of the fourth transistor M4 is connected to a second clock signal terminal CKB; a gate of the fifth transistor M5 is connected to the drain of the third transistor M3 and the source of the fourth transistor M4, a drain of the fifth transistor M5 is connected to the first level signal terminal, a source of the fifth transistor M5 is connected to an output terminal OUT of the shift register, and a first capacitor C1 is connected between the gate and the drain of the fifth transistor M5; a gate of the sixth transistor M6 is connected to the drain of the first transistor M1, a source of the sixth transistor M6 is connected to the second clock signal terminal CKB, a drain of the sixth transistor M6 is connected to the output terminal OUT of the shift register, and a second capacitor C2 is connected between the gate and the drain of the sixth transistor M6.

Each of the first to sixth transistors M1-M6 is a P-channel Metal Oxide Semiconductor (PMOS) transistor. Herein referring to FIG. 2, an operation timing of the shift register is described as following: a high level signal VGH is provided from the first level signal terminal, a low level signal VGL is provided from the second level signal terminal, an input signal in received from the input terminal of the shift register is a low level pulse signal, a first clock signal ck is received from the first clock signal terminal, and a second clock signal ckb is received from the second clock signal terminal, wherein the second clock signal ckb has a phase inverse to a phase of the first clock signal ck. With the above operation timing, the input signal in is shifted and outputted, that is, the output signal out outputted from the output terminal of the shift register is shifted by half of a clock cycle with respect to the input signal in.

However, in driving the shift register, the output terminal OUT shall be at a stage of maintaining a high level after outputting the low level signal, the level of a node N2 can be pulled down somewhat in the case where a level of the second clock signal ckb is changed from a high level to a low level, and hence the output terminal is affected due to the coupling effect of the second capacitor C2, that is, the output signal is unstable and severely distorted. The distortion of the output signal will affect the operation reliability of the gate driver, and hence affect the quality of the image displayed by the Liquid Crystal Display.

Therefore, there is an object of the present invention to provide a shift register which outputs a signal with minimal or no distortion.

BRIEF SUMMARY OF THE INVENTION

An object of the present invention is to provide a shift register and a driving method thereof, in order to solve the problem of the severely distorted output signal of conventional shift registers.

In order to solve the above technical problem, embodiments of the present invention provide a shift register including an input terminal, an output terminal, a first clock signal terminal, a second clock signal terminal, a first level signal terminal, and a second level signal terminal. The shifter register also includes a first transistor, a second transistor, a third transistor, a fourth transistor, and a fifth transistor.

A gate of the first transistor is connected to the output terminal of the shift register, a drain of the first transistor is connected to the first level signal terminal, and a source of the first transistor is connected to a drain of the second transistor and a gate of the fourth transistor;

A gate of the second transistor is connected to the first clock signal terminal, and a source of the second transistor is connected to the second level signal terminal;

A gate of the third transistor is connected to the first clock signal terminal, a source of the third transistor is connected to the input terminal of the shift register, and a drain of the third transistor is connected to a gate of the fifth transistor;

A drain of the fourth transistor is connected to the first level signal terminal, a source of the fourth transistor is connected to the output terminal of the shift register, and a first capacitor is connected between the gate and the drain of the fourth transistor;

A source of the fifth transistor is connected to the second clock signal terminal, a drain of the fifth transistor is connected to the output terminal of the shift register, and a second capacitor is connected between the gate and the drain of the fifth transistor.

Embodiments of the present invention further provide a method for driving the shift register. The method includes:

In a first time period, in which the second transistor and the third transistor are turned on under the control of the first clock signal received from the first clock signal terminal, and the second transistor transfers the second level signal received from the second level signal terminal to the gate of the fourth transistor to turn on the fourth transistor, so as to transfer a first level signal received from the first level signal terminal to the output terminal of the shift register, while the third transistor transfers the input signal received from the input terminal of the shift register to the gate of the fifth transistor to turn on the fifth transistor, so as to transfer the second clock signal received from the second clock signal terminal to the output terminal of the shift register;

In a second time period, in which the fifth transistor is turned on to transfer the second clock signal provided from the second clock signal terminal to the output terminal; and In a third time period, in which the fourth transistor is turned on to transfer the first level signal received from the first level signal terminal to the output terminal.

DETAILED DESCRIPTION OF THE PREFERRED EMBODIMENTS

The shift register and driving method thereof provided by embodiments of the present invention will be further described in detail below in conjunction with the accompanying drawings. Advantages and features of the present invention will become more apparent from the following description and claims. It should be noted that the accompanying drawings are shown in a very simplified way and are not shown with a precise ratio, for the purpose of facilitating the clear and convenient description of the embodiments of the present invention.

[First Embodiment]

Figure 1:
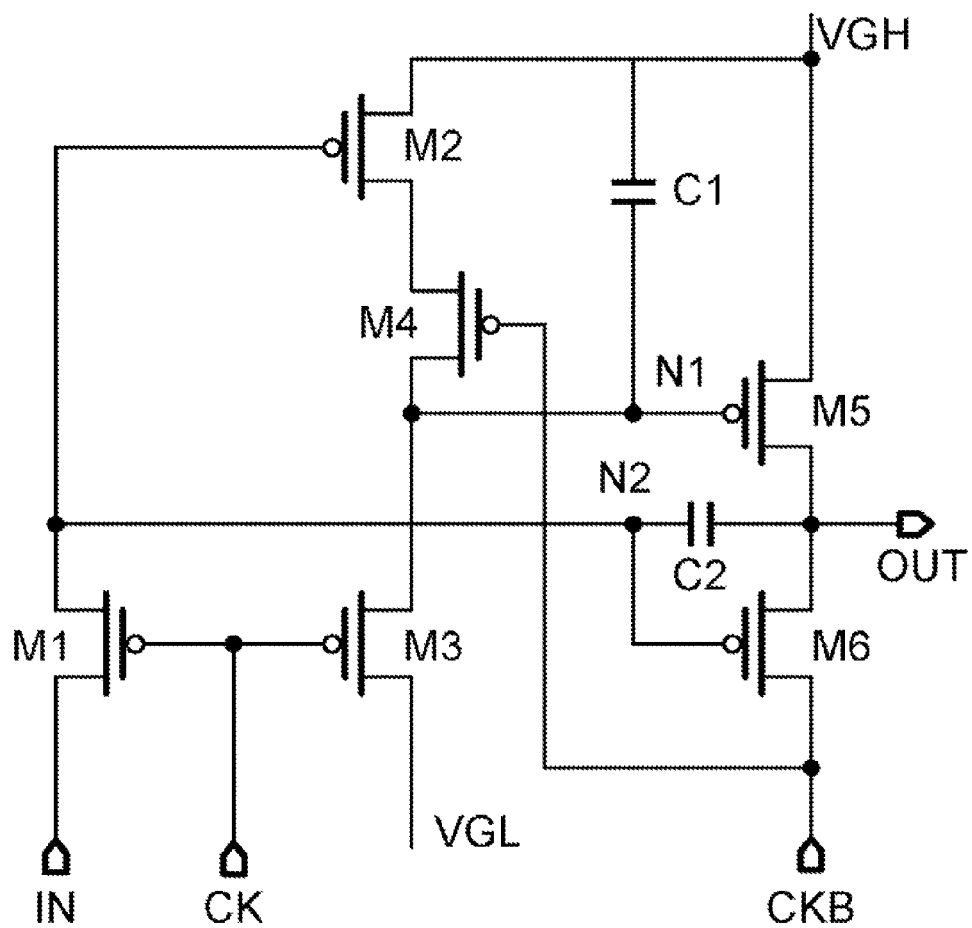
FIG. 1 is a schematic diagram showing a circuit of a conventional shift register.
Figure 2:
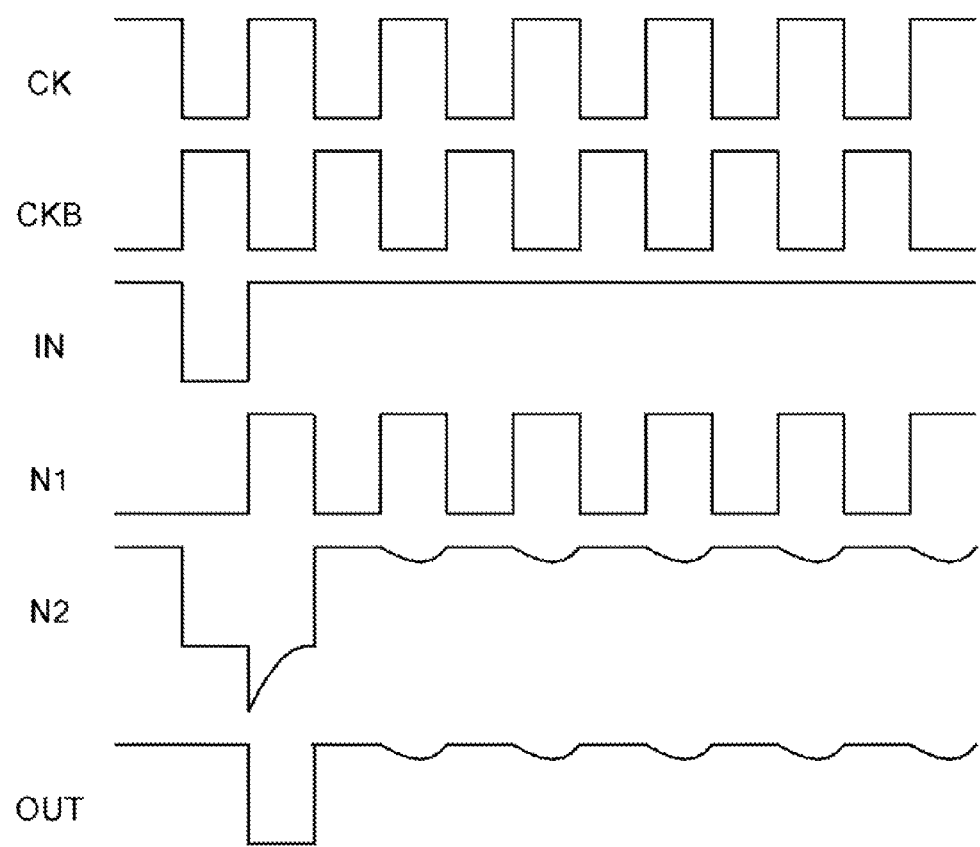
FIG. 2 is an operation timing diagram of the shift register shown in FIG. 1.
Figure 3:
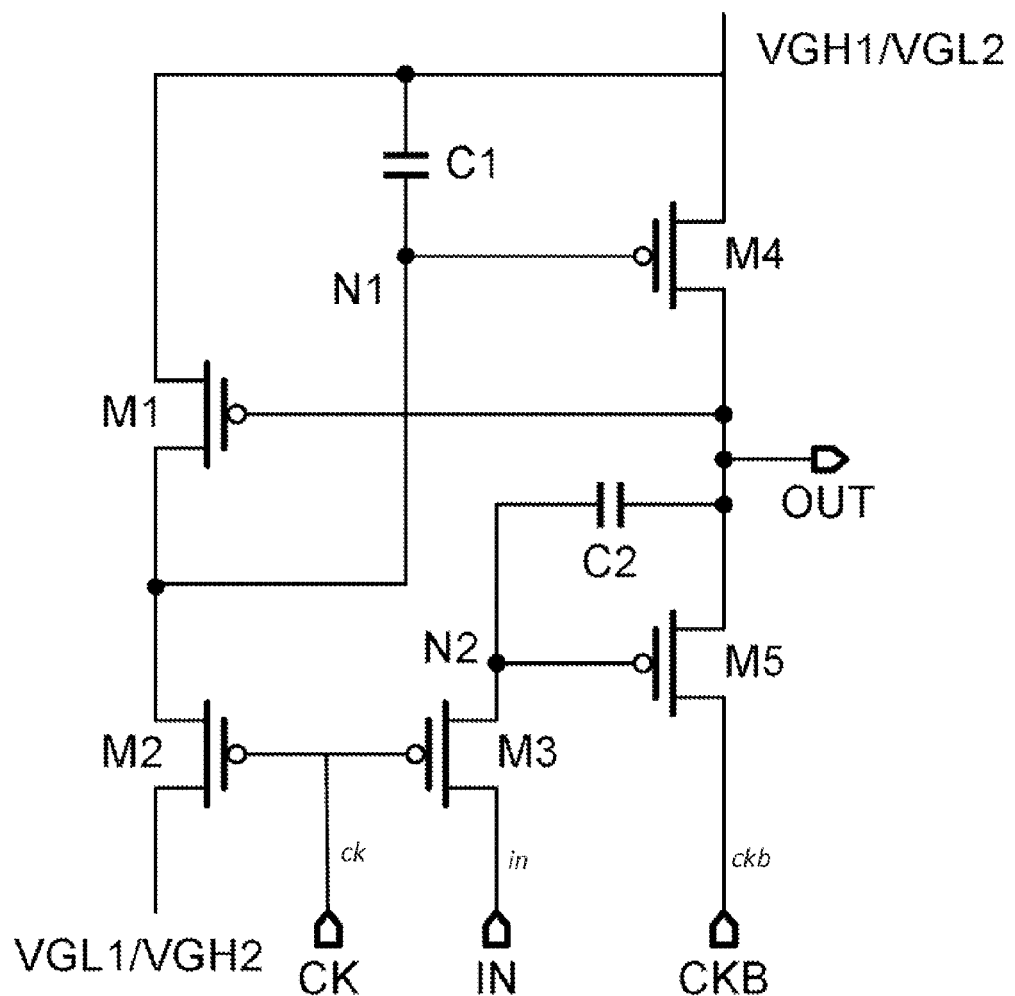
FIG. 3 is a schematic diagram showing the structure of a shift register according to an embodiment of the present invention.

FIG. 3 is a schematic circuit diagram of a shift register according to a first embodiment of the present invention. As shown in FIG. 3, the shift register includes: a first transistor M1, a second transistor M2, a third transistor M3, a fourth transistor M4, and a fifth transistor M5.

A gate of the first transistor M1 is connected to an output terminal OUT of the shift register, a drain of the first transistor M1 is connected to a first level signal terminal VGH1, and a source of the first transistor M1 is connected to a drain of the second transistor M2 and a gate of the fourth transistor M4.

A gate of the second transistor M2 is connected to a first clock signal terminal CK, and a source of the second transistor M2 is connected to a second level signal terminal VGL1.

A gate of the third transistor M3 is connected to the first clock signal terminal CK, a source of the third transistor M3 is connected to an input terminal IN of the shift register, and a drain of the third transistor M3 is connected to a gate of the fifth transistor M5.

A drain of the fourth transistor M4 is connected to the first level signal terminal VGH1, a source of the fourth transistor M4 is connected to the output terminal OUT of the shift register, and a first capacitor C1 is connected between the gate and the drain of the fourth transistor M4.

A source of the fifth transistor M5 is connected to a second clock signal terminal CKB, a drain of the fifth transistor M5 is connected to the output terminal OUT of the shift register, and a second capacitor C2 is connected between the gate and the drain of the fifth transistor M5.

Specifically, in the embodiment, the first transistor M1, the second transistor M2, the third transistor M3, the fourth transistor M4, and the fifth transistor M5 are all PMOS transistors.

Figure 4:
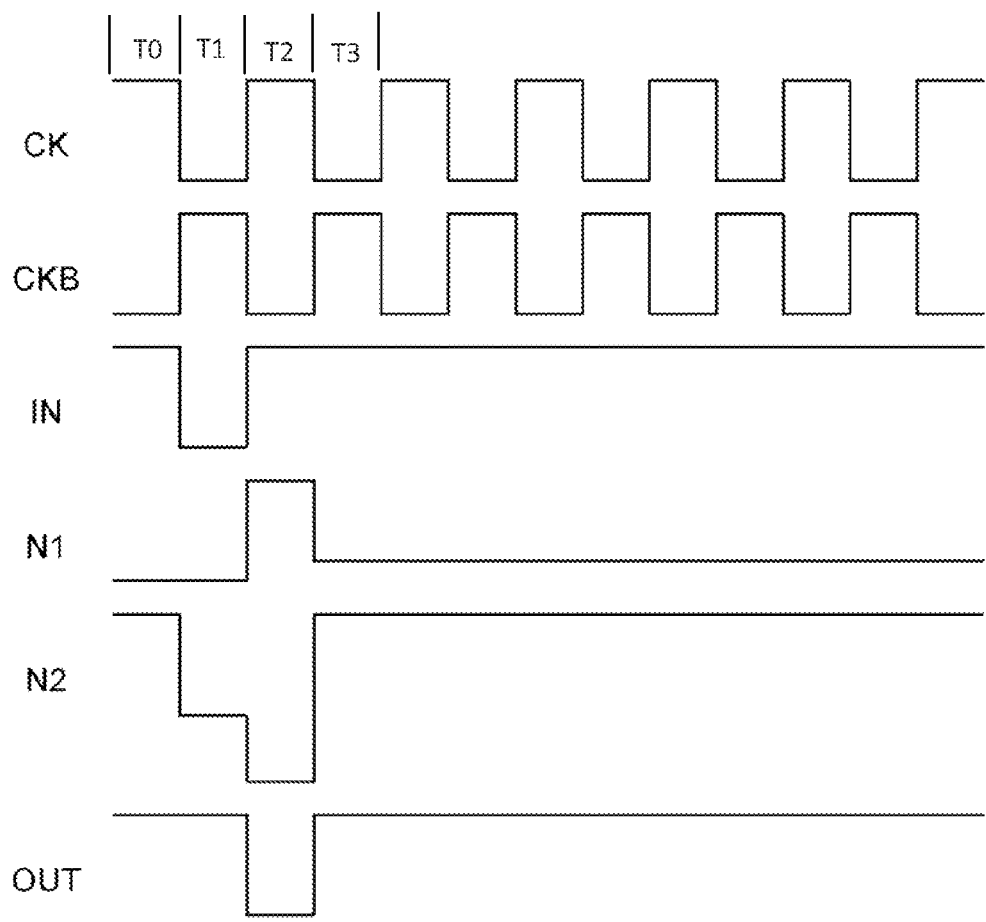
FIG. 4 is an operation timing diagram of the shift register shown in FIG. 3 constructed by PMOS transistors.

FIG. 4 is an operation timing diagram of the shift register shown in FIG. 3 constructed by PMOS transistors. The driving method of the shift register will be described below in conjunction with FIGS. 3 and 4.

In the embodiment, an input signal from the first level signal terminal VGH1 is a high level signal (which has a constant level value that is greater than the level value of a low level signal described hereinafter), an input signal from the second level signal terminal VGL1 is a low level signal (which has a constant level value that is less than the level value of the aforementioned high level signal), the input terminal IN of the shift register is applied a low level pulse signal, the first clock signal terminal CK is applied a first clock signal ck, and the second clock signal terminal CKB is applied a second clock signal ckb. Here, the second clock signal ckb has a phase inverse to a phase of the first clock signal ck (that is, the first clock signal ck and the second clock signal ckb have the same cycle but opposite phases, the second clock signal ckb is at a low level when the first clock signal ck is at a high level, or the second clock signal ckb is at a high level when the first clock signal ck is at a low level).

As for the shift register, it should be noted that those skilled in the art would understand the level ranges given to the high level signal and the low level signal depending upon performance parameters of the transistor used in the shift register. Hence the level ranges will not be described again in the application. Examples of the level values are given in FIGS. 4 and 5 but not limit the application.

Referring to FIG. 4 again, the shift register operates specifically in the following stages of an initial stage, a first stage, a second stage and a third stage during its operation.

In the initial stage (time period) T0, the first clock signal terminal CK and the second clock signal terminal CKB input clock signals of one clock cycle, a high level signal is inputted to the input terminal IN, and the output terminal OUT outputs a high level signal correspondingly, in this case, the whole register is in a reset and adjustment stage to ensure the reliability of the subsequent output signal.

In the first stage (time period) T1, the first clock signal terminal CK receives a low level clock signal of a half cycle, the second clock signal terminal CKB receives a high level clock signal of a half cycle, and the input terminal IN receives a low level signal (i.e., the low level part of the whole low level pulse signal).

During this time period T1, the second transistor M2 and the third transistor M3 are turned on under the control of the first clock signal ck, then the second transistor M2 transfers the second level signal (i.e., a low level signal) to the gate of the fourth transistor M4 to turn on the fourth transistor M4. In the case that the fourth transistor M4 is turned on, the first level signal (i.e., a high level signal) is transferred to the output terminal OUT, that is, the output terminal OUT receives the high level signal from the first level signal terminal VGH1.

In the first time period T1, the fourth transistor M4 transfers the first level signal (i.e., a high level signal) to the output terminal OUT, while the third transistor M3 transfers the input signal (i.e., a low level signal) to the gate of the fifth transistor M5 to turn on the fifth transistor M5. In the case that the fifth transistor M5 is turned on, the second clock signal (i.e., a high level signal) is transferred to the output terminal OUT, that is, the output terminal OUT receives the high level signal from the second clock signal terminal.

In the second stage (time period) T2, the first clock signal terminal CK receives a high level clock signal of a half cycle, the second clock signal terminal CKB receives a low level clock signal of a half cycle, and the input terminal IN receives a high level signal. At this time, due to the effect of the second capacitor C2 (i.e., the coupling effect of the capacitor), a low level is maintained at the node N2 to turn on the fifth transistor M5 to transfer the second clock signal (i.e., a low level signal) to the output terminal OUT. Meanwhile, due to the effect of the output terminal OUT, the first transistor M1 is turned on to transfer the high level signal from the first level signal terminal VGH1 to the node N1 so that the level of the node N1 is a high level so as to turn off the fourth transistor M4.

Thus, the shift function of the shift register is achieved, that is, the low level pulse signal at the input terminal IN is shifted by a half cycle by the shift register. In other words, the shift register provides an output signal at the output terminal OUT that is the input signal at the input terminal IN with a half cycle delay The shift register, which is typically used in a gate driver, shall have a function of maintaining for a time period. In this case, the shift register is required to maintain a high level output.

In the third stage (time period) T3, when the first clock signal terminal CK receives a low level clock signal of a half cycle, the fourth transistor M4 is turned on to transfer the high level signal from the first level signal terminal VGH1 to the output terminal OUT; and when the first clock signal terminal CK receives a high level clock signal of a half cycle, a low level is maintained at the node N1 by the first capacitor C1, so as to turn on the fourth transistor M4 to further transfer the stable high level signal from the first level signal terminal VGH1 to the output terminal OUT, thereby ensuring that the output terminal of the shift register outputs the high level signal stably.

As can be seen in the design of the shift register of the present embodiment, when the output terminal is in a stage of maintaining its output, i.e., in the third stage, it is possible for the output terminal to always receives the stable first level signal from the first level signal terminal VGH1, thereby preventing the distortion of the output signal and improving the reliability of the shift register and driving method thereof.

[Second Embodiment]

The difference between the second embodiment and the first embodiment is that the transistors (the first transistor M1, the second transistor M2, the third transistor M3, the fourth transistor M4, and the fifth transistor M5) are NMOS transistors for the shift register shown in FIG. 3.

Figure 5:
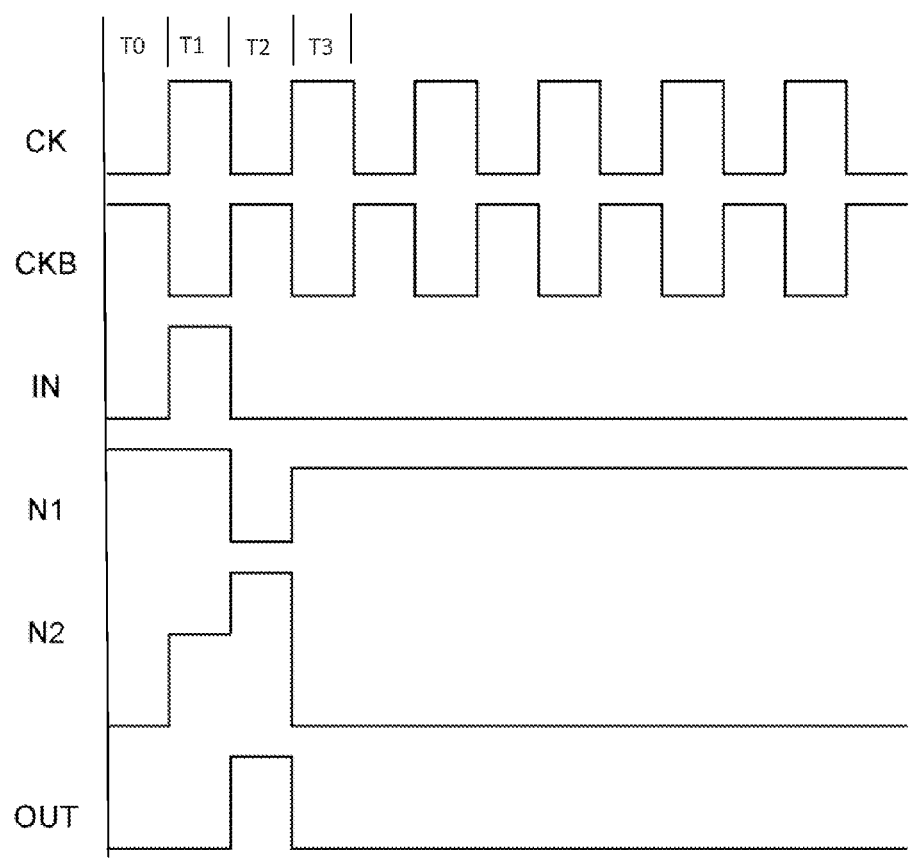
FIG. 5 is an operation timing diagram of the shift register shown in FIG. 3 constructed by NMOS transistors.

Here, the operation timing of the shift register is shown in FIG. 5. An input signal from the first level signal terminal VGL2 is a low level signal, an input signal from the second level signal terminal VGH2 is a high level signal, the input terminal IN of the shift register receives a high level pulse signal, the first clock signal terminal CK receives a first clock signal ck, and the second clock signal terminal CKB receives a second clock signal ckb, where, the second clock signal ckb has a phase inverse to a phase of the first clock signal ck.

Referring to FIGS. 5 again, the shift register operates specifically in the following stages of an initial stage, a first stage, a second stage and a third stage during its operation.

In the initial stage (time period) T0, the first clock signal terminal CK and the second clock signal terminal CKB input clock signals of one clock cycle, a low level signal is inputted to the input terminal IN, and the output terminal OUT outputs a low level signal correspondingly, in this case, the whole register is in a reset and adjustment stage to ensure the reliability of the subsequent output signal.

In the first stage (time period) T1, the first clock signal terminal CK receives a high level clock signal of a half cycle, the second clock signal terminal CKB receives a low level clock signal of a half cycle, and the input terminal IN receives a high level signal (i.e., the high level part of the whole high level pulse signal).

During the time period T1, the second transistor M2 and the third transistor M3 are turned on in response to the first clock signal ck, then the second transistor M2 transfers the second level signal (i.e., a high level signal) to the gate of the fourth transistor M4 to turn on the fourth transistor M4. In the case that the fourth transistor M4 is turned on, the first level signal (i.e., a low level signal) is transferred to the output terminal OUT, that is, the output terminal OUT receives the low level signal from the first level signal terminal VGL2.

In the first stage (time period) T1, the fourth transistor M4 transfers the first level signal (i.e., a low level signal) to the output terminal OUT, while the third transistor M3 transfers the input signal (i.e., a high level signal) to the gate of the fifth transistor M5 to turn on the fifth transistor M5. In the case that the fifth transistor M5 is turned on, the second clock signal (i.e., a low level signal) is transferred to the output terminal OUT, that is, the output terminal OUT receives the low level signal from the second clock signal terminal.

In the second stage (time period) T2, the first clock signal terminal CK receives a low level clock signal of a half cycle, the second clock signal terminal CKB receives a high level clock signal of a half cycle, and the input terminal IN receives a low level signal.

During this time period, due to the effect of the second capacitor C2 (i.e., the coupling effect of the capacitor), a high level is maintained at the node N2 to turn on the fifth transistor M5, to transfer the second clock signal (i.e., a high level signal) to the output terminal OUT. Meanwhile, due to the effect of the output terminal OUT, the first transistor M1 is turned on to transfer the low level signal from the first level signal terminal VGL2 to the node N1 so that the level of the node N1 is a high level to turn off the fourth transistor M4.

Thus, the shift function of the shift register is achieved, that is, the high level pulse signal at the input terminal IN is shifted (delayed) by a half cycle and output at the output terminal OUT.

The shift register, which is typically used in a gate driver, shall have a function of maintaining a stable state for a time period. In this case, the shift register is required to maintain a low level output.

In the third stage (time period) T3, when the first clock signal terminal CK receives a high level clock signal of a half cycle, the fourth transistor M4 is turned on to transfer the low level signal from the first level signal terminal VGL2 to the output terminal OUT; and when the first clock signal terminal CK receives a low level clock signal of a half cycle, a high level is maintained at the node N1 by the first capacitor C1, so as to turn on the fourth transistor M4 to further transfer the stable low level signal from the first level signal terminal VGL2 to the output terminal OUT, thereby ensuring that the output terminal of the shift register outputs the low level signal stably.

The preferred embodiments of the present invention have been described above. However, the invention should be regarded as illustrative rather than restrictive, and not being limited to the embodiments described above. Modifications and variations may be made in those embodiments by those skilled in the art without departing from the present invention as defined by the following claims.

What is claimed is:

1. A shift register having an input terminal, an output terminal, a first clock signal terminal, a second clock signal terminal, a first level signal terminal, and a second level signal terminal, the shift register comprising: a first transistor, a second transistor, a third transistor, a fourth transistor, and a fifth transistor, a first capacitor, and a second capacitor, wherein a gate of the first transistor is connected to the output terminal, a drain of the first transistor is connected to the first level signal terminal, and a source of the first transistor is connected to a drain of the second transistor and a gate of the fourth transistor;

wherein a gate of the second transistor is connected to the first clock signal terminal, and a source of the second transistor is connected to the second level signal terminal;

wherein a gate of the third transistor is connected to the first clock signal terminal, a source of the third transistor is connected to the input terminal, and a drain of the third transistor is connected to a gate of the fifth transistor;

wherein a drain of the fourth transistor is connected to the first level signal terminal, a source of the fourth transistor is connected to the output terminal, and a first capacitor is connected between the gate and the drain of the fourth transistor;

wherein a source of the fifth transistor is connected to the second clock signal terminal, a drain of the fifth transistor is connected to the output terminal, and a second capacitor is connected between the gate and the drain of the fifth transistor.

2. The shift register of claim 1, wherein the first transistor, the second transistor, the third transistor, the fourth transistor, and the fifth transistor are PMOS transistors.

3. The shift register of claim 2, wherein an input signal received from the first level signal terminal is a high level signal, an input signal received from the second level signal terminal is a low level signal, the input terminal of the shift register receives a low level pulse signal, the first clock signal terminal receives a first clock signal, and the second clock signal terminal receives a second clock signal, the first clock signal and the second clock signal having a phase opposite to each other.

4. The shift register of claim 1, wherein the first transistor, the second transistor, the third transistor, the fourth transistor, and the fifth transistor are NMOS transistors.

5. The shift register of claim 4, wherein the first level signal terminal receives a low level signal, the second level signal terminal receives a high level signal, the input terminal of the shift register receives a high level pulse signal, the first clock signal terminal receives a first clock signal, and the second clock signal terminal receives a second clock signal, the first clock signal and the second clock signal having a phase opposite to each other.

6. A method for driving a shift register of claim 1, the method comprising:

in a first time period, turning on the second transistor and the third transistor in response to a first clock signal received from the first clock signal terminal;

transferring a second level signal received from the second level signal terminal to turn on the fourth transistor;

transferring a first level signal received from the first level signal terminal to the output terminal through the turned-on fourth transistor;

transferring an input signal received from the input terminal to turn on the fifth transistor through the turned-on third transistor;

in a second time period, transferring a second clock signal provided from the second clock signal terminal to the output terminal through the turned-on fifth transistor, wherein the fifth transistor is turned on through a coupling effect of the second capacitor; and in a third time period, transferring a first level signal received from the first level signal terminal to the output terminal through the turned-on fourth transistor, wherein the fourth transistor is turned on through a coupling effect of the first capacitor.

7. The method of claim 6, wherein the first transistor, the second transistor, the third transistor, the fourth transistor, and the fifth transistor are PMOS transistors.

8. The driving method of the shift register of claim 7, wherein the first level signal is a high level signal, the second level signal is a low level signal, the input signal received from the input terminal of the shift register is a low level pulse signal, the first clock signal and the second clock signal having a phase opposite to each other.

9. The driving method of the shift register of claim 8, wherein in the first time period, the output terminal outputs a high level signal; and in the second time period, the output terminal outputs a low level signal.

10. The driving method of the shift register of claim 6, wherein the first transistor, the second transistor, the third transistor, the fourth transistor, and the fifth transistor are NMOS transistors.

11. The driving method of the shift register of claim 10, wherein the first level signal is a low level signal, the second level signal is a high level signal, the input signal is a high level pulse signal, and the second clock signal has a phase inverse to a phase of the first clock signal.

12. The driving method of the shift register of claim 11, wherein in the first time period, the output terminal outputs a low level signal; and in the second time period, the output terminal outputs a high level signal.

13. The shift register of claim 1, wherein the first capacitor is operative to turn on the fourth transistor to connect the first level signal terminal to the output terminal.

14. The shift register of claim 1, wherein the second capacitor is operative to turn on the fifth transistor to connect the second clock signal terminal to the output terminal.

15. The shift register of claim 1, wherein the shift register has five transistors.

* * * * *